United States Patent [19]

Doan et al.

[11] Patent Number: 5,073,518

[45] Date of Patent: Dec. 17, 1991

[54] PROCESS TO MECHANICALLY AND PLASTICALLY DEFORM SOLID DUCTILE METAL TO FILL CONTACTS OF CONDUCTIVE CHANNELS WITH DUCTILE METAL AND PROCESS FOR DRY POLISHING EXCESS METAL FROM A SEMICONDUCTOR WAFER

[75] Inventors: Trung Doan; Mark E. Tuttle; Tyler A. Lowrey, all of Boise, Id.

[73] Assignee: Micron Technology, Inc., Boise, Id.

[21] Appl. No.: 718,206

[22] Filed: Jun. 20, 1991

Related U.S. Application Data

[63] Continuation-in-part of Ser. No. 595,540, Oct. 11, 1990, abandoned, Ser. No. 510,535, Apr. 18, 1990, abandoned, and Ser. No. 441,611, Nov. 27, 1989, abandoned, said Ser. No. 595,540, and Ser. No. 510,535, each is a continuation-in-part of Ser. No. 441,611.

[51] Int. Cl.$^5$ ............................................. H01L 21/44
[52] U.S. Cl. .................................. 437/180; 437/189; 437/197; 437/225; 156/645
[58] Field of Search ............... 437/180, 189, 197, 225; 156/645

[56] References Cited

U.S. PATENT DOCUMENTS

| | | | |
|---|---|---|---|
| 2,767,287 | 10/1956 | Kahan | 437/180 |
| 3,778,684 | 12/1973 | Fischer et al. | 136/260 |
| 4,569,876 | 2/1986 | Nakakita | 437/192 |
| 4,574,467 | 3/1986 | Halfacre et al. | 437/197 |
| 4,879,258 | 11/1989 | Fisher | 437/225 |

FOREIGN PATENT DOCUMENTS 57-097652  6/1982  Japan ................................. 437/180

OTHER PUBLICATIONS

C. H. Scrivner, Jr., "Polishing Technique to Remove Al Lands from Semiconductor Chips," *IBM Technical Disclosure Bulletin*, vol. 24, No. 4, Sep. 1981, p. 2138.

*Primary Examiner*—Brian E. Hearn
*Assistant Examiner*—Laura M. Holtzman
*Attorney, Agent, or Firm*—Wells, St. John & Roberts

[57] ABSTRACT

A method of forming a conductive via plug or an interconnect line, or both, of solid ductile metal within an integrated circuit using plastic deformation of the solid metal, and a dry polishing method of removing excess metal from a metal layer atop an underlying layer on a semiconductor substrate wafer. The process begins with a wafer having a dielectric layer, the upper surface of which has been planarized. If both conductive via plugs and interconnect lines are both required within the circuit, a first masking step defines the interconnect lines. A first etch creates channels in the interconnect line locations. A second masking step defines the vias. A second etch creates the vias which pass through the dielectric layer to conductive regions below where contact is to be made. A layer of solid ductile metal is then deposited on top of the dielectric layer. Using a disk or pad which is held in contact with the ductile metal layer, metal of the ductile layer is mechanically worked to plastically deformed more deeply into the channels and vias. The wafer is then dry polished with a solid material having a hardness which is less than both the hardness of the metal and the hardness of the underlying layer to provide remaining metal from the metal layer which is only in conductive interconnect lines or vias.

49 Claims, 13 Drawing Sheets

PROCESS TO MECHANICALLY AND PLASTICALLY DEFORM SOLID DUCTILE METAL TO FILL CONTACTS OF CONDUCTIVE CHANNELS WITH DUCTILE METAL AND PROCESS FOR DRY POLISHING EXCESS METAL FROM A SEMICONDUCTOR WAFER

RELATED APPLICATION DATA

This patent resulted from a continuation-in-part application of U.S. patent application Ser. Nos. 07/595,540 filed on Oct. 11, 1990; 07/510,535 filed on Apr. 18, 1990; and Ser. No. 07/441,611 filed on Nov. 27, 1989. Each was abandoned in favor of the application from which this patent matured. U.S. patent application Ser. Nos. 07/595,540 and 07/510,535 were each a continuation-in-part of the 07/441,611 application. The file histories of these three prior applications are hereby incorporated by reference.

TECHNICAL FIELD

This invention relates to semiconductor manufacturing technology. More specifically, it relates to methods for creating metal interconnections between conductive layers and metal interconnect lines in sub-micron manufacturing processes, and to methods for removing excess metal from substrate wafers to define metal interconnect lines.

BACKGROUND OF THE INVENTION

As semiconductor device dimensions become finer and finer, it becomes increasingly difficult to obtain adequate step coverage within interconnect vias using metal that has been deposited by traditional deposition techniques. In addition, traditional methods of forming metal interconnect lines are affected by particle contamination and defective metal layer etches. Generally, particle contamination is responsible for open circuits in the metal interconnect system, while a defective etch of a metal layer may result in both shorted and open circuits.

Another problem associated with the creation of metal interconnect lines is that metal layers are relatively difficult to etch as compared, for example, to silicon dioxide. As device dimensions become smaller, electromigration becomes a more significant problem. Since electromigration in semiconductor devices is generally associated with the use of pure aluminum for interconnect lines, the problem is most easily eliminated by alloying other metals, such as copper, with aluminum. However, alloys of aluminum that do not exhibit at least minimal grainboundary diffusion in the presence of an electric current are generally relatively difficult to etch using plasma or reactive-ion etching techniques.

What is needed is a new technique for creating metal interconnect lines and via plugs from ductile metal alloys which do not exhibit pronounced electromigration characteristics. In addition, the technique should provide improved step coverage over prior art processes and should eliminate the metal etch step altogether.

After the metal for the interconnect lines and vias has been deposited on the substrate, it is necessary to remove the excess metal from the surface of the wafer to define the electrically isolated interconnect lines. One such method of achieving this metal removal is with a slurry polish. Here, the wafer surface is impacted with a stream of liquid containing an abrasive agent (collectively, a slurry) to cause excess surface metal to be removed. This process must be carefully controlled with a defined end point to assure that no more material is removed than is desired.

This invention also comprises an improved method for removing the excess metal from the surface of the wafer to define the electrically isolated interconnect lines.

BRIEF DESCRIPTION OF THE DRAWINGS

Preferred embodiments of the invention are illustrated in the accompanying drawings, in which:

FIG. 3 is an isometric view of the wafer portion of FIG. 2, following removal of the first photo mask;

FIG. 10 is an isometric view of the wafer portion of FIG. 9, with the frontal portion up to the plane defined by broken line 8—8 in FIG. 9 removed to show a cross-section through the via;

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

In part, the present invention improves the step coverage of a ductile metal used as an interconnect material within an integrated circuit. Such is accomplished by utilizing mechanical energy to plastically deform a deposited solid ductile metal layer and force the ductile metal into interconnect line and via channels (alternately termed "depressions"). The process begins with a wafer having a dielectric layer, the upper surface of which has been planarized. Following a first masking step, channels are etched in the upper surface of the dielectric layer. Following a second masking step, vias are etched through the dielectric layer to the conductive layer below where contact is to be made. A layer of solid ductile metal is then deposited on top of the dielectric layer by any one of a number of means (e.g., sputter deposition or chemical vapor deposition) to produce a layer which comprises a solid, unitary integral mass of metal. Using a disk that is held in contact with the solid ductile metal layer and preferably rotated bidirectionally, the solid mass of ductile metal is plastically deformed so that it is worked into the via plugs and interconnect channels. All excess metal is then removed and the topography is coplanar with the planer surface of the dielectric layer. Metal remains only in the vias and interconnect channels.

This method of creating via plugs and interconnect lines has several important advantages over the prior art. Firstly, via walls may be etched more steeply since mechanical energy is used to plastically deform and force metal into them. Secondly, no etching of metal layers is necessary for the creation of either interconnect lines or via plugs. Rather, via and interconnect channels are etched in the planarized dielectric layer, and these channels are filled with metal using the aforementioned process. The fact that no etching is required permits the use of nearly any ductile metal or alloy thereof, without regard for the ease with which it is etched.

In accordance with another aspect of the invention, excess metal from the metal layer which fills the via and interconnection channels is removed by a dry polishing process that uses no slurry. This dry polishing is accomplished with a solid material having a hardness which is less than both the hardness of the metal and the hardness of the immediately underlying layer. The dry polishing is continued to provide remaining metal from the metal layer which is only in conductive interconnect lines or vias.

The remaining metal is then annealed to cause recrystallization in the event of damage to the crystal structure of the deposited metal the result of plastic deformation. One anneal approach utilizes a laser which is impinged upon the wafer surface to cause metal melting and recrystallization as it refreezes. Unwanted portions of the metal layer are removed using traditional etching techniques to leave a predetermined pattern of conductive paths.

Figure 1:
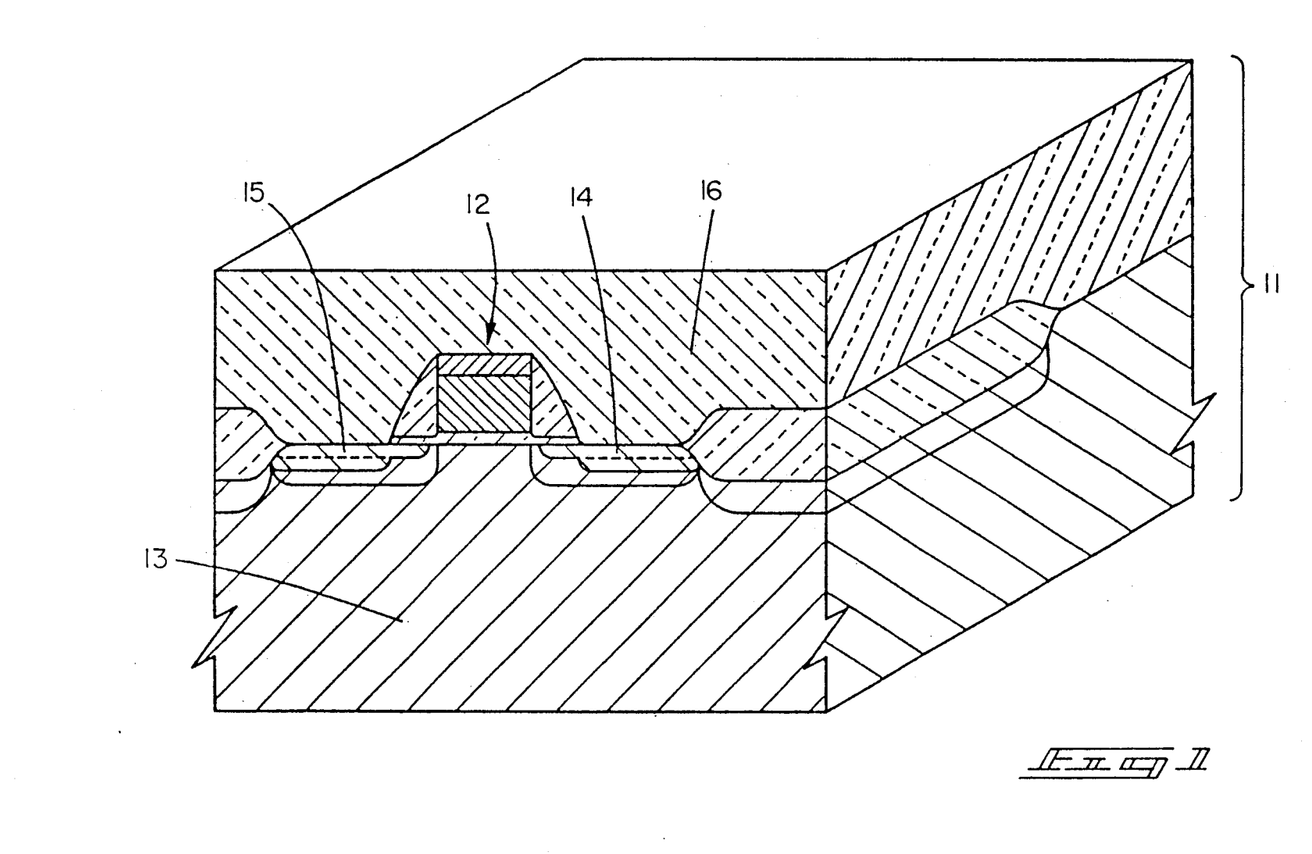
FIG. 1 is an isometric view of a portion of a partially-processed semiconductor wafer which depicts a field-effect transistor (FET) having as a drain a conductively-doped region within a silicon substrate, all of which is overlaid by a planarized dielectric layer of silicon dioxide.

The discussion proceeds with reference to preferred embodiments illustrated in the figures. A portion of a partially-processed semiconductor wafer 11 is shown in FIG. 1. A field-effect transistor (FET) 12 has been constructed on top of a silicon substrate 13, a portion of which has been doped to serve as the FET drain 14, and another portion of which has been doped to serve as the FET source 15. All topography has been covered by a silicon dioxide dielectric layer 16 the upper surface of which has been planarized. In order to completely describe the present invention, it will be assumed that an interconnect line must be formed on top of dielectric layer 16 and that the interconnect line must connect with FET drain 14.

Figure 2:
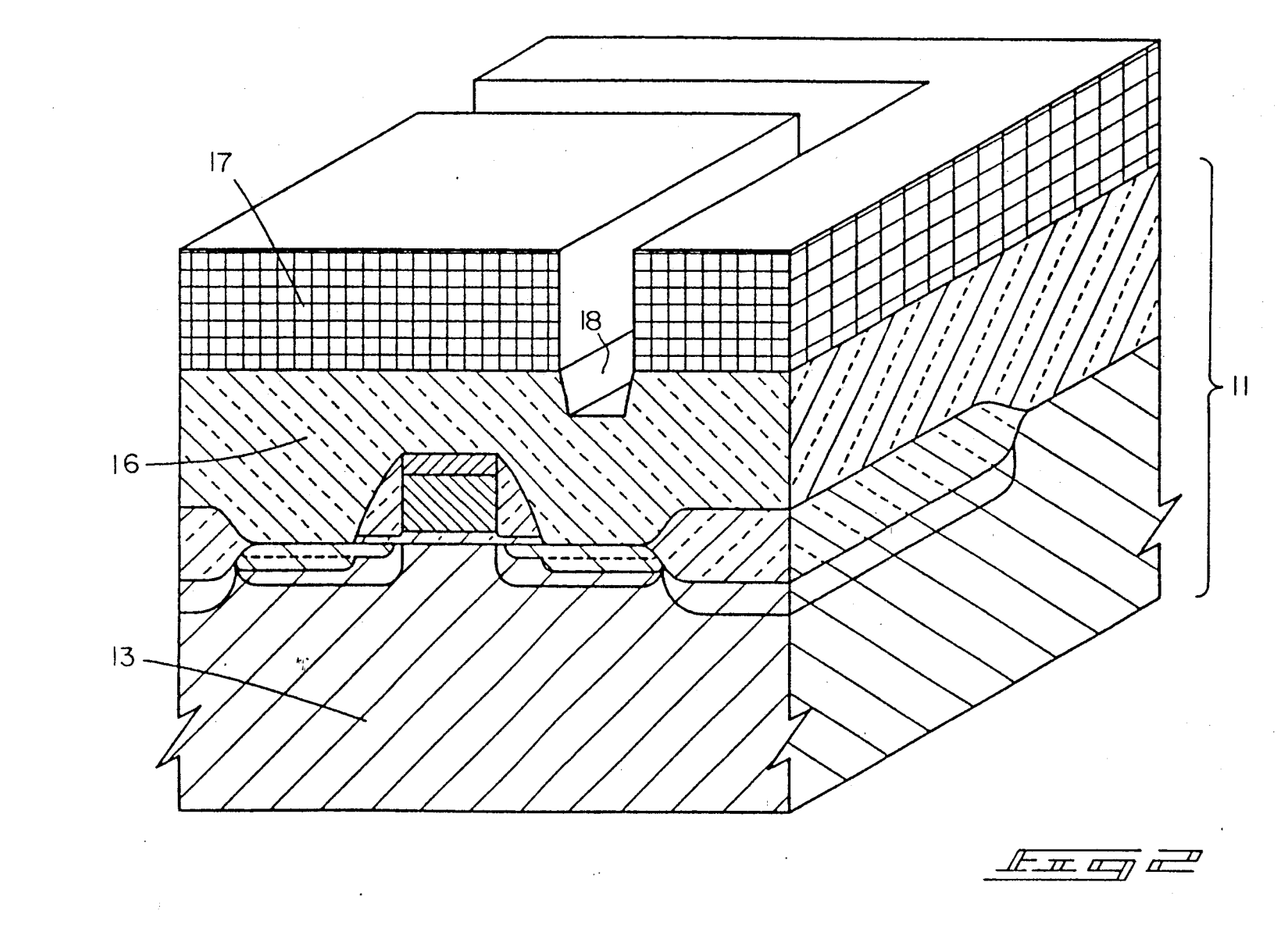
FIG. 2 is an isometric view of the wafer portion of FIG. 1, following a first photomasking step which defines an interconnect channel and a first dry oxide etch which creates the channel.

Referring now to FIG. 2, a first photoresist mask 17 has been applied to wafer 11 on top of dielectric layer 16. First photo mask 17 defines the geometries of desired interconnect lines on the surface of dielectric layer 16. Only a single interconnect line will be created on the wafer portion shown in this Figure. For purposes of the continuing discussion, dielectric layer 16 has a defined hardness. A first dry oxide etch forms interconnect line channel 18 which will be filled with solid ductile metal in a later step, thus becoming one of the desired interconnect lines on the wafer.

Referring now to FIG. 3, channel 18 etched in dielectric layer 16 is shown following the removal of first photo mask 17.

Figure 4:
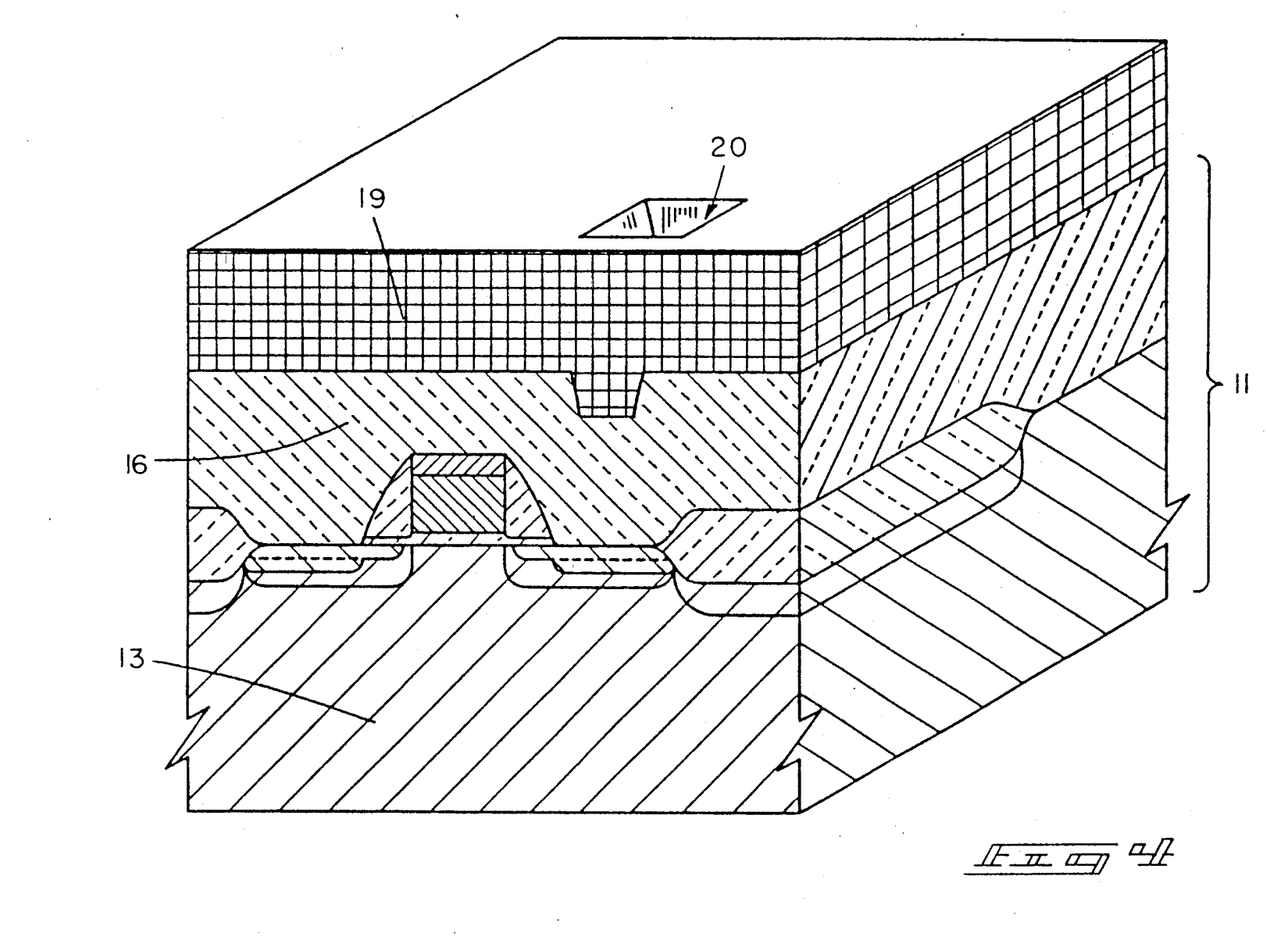
FIG. 4 is an isometric view of the wafer portion of FIG. 3, following a second photomasking step which defines an interconnect via superimposed on the previously created channel and a second dry oxide etch which creates the via.

Referring now to FIG. 4, a second photoresist mask 19 which defines interconnect vias, has been applied to wafer 11. A single via will be formed within wafer 11. The via will be positioned such that it, at least partially, coincides with the already etched channel 18 so that when the via plug and interconnect line are formed, they will be in electrical communication with one another. A second dry oxide etch forms via channel 20 which, along with interconnect line channel 18, will be filled with solid ductile metal as described below.

Figure 5:
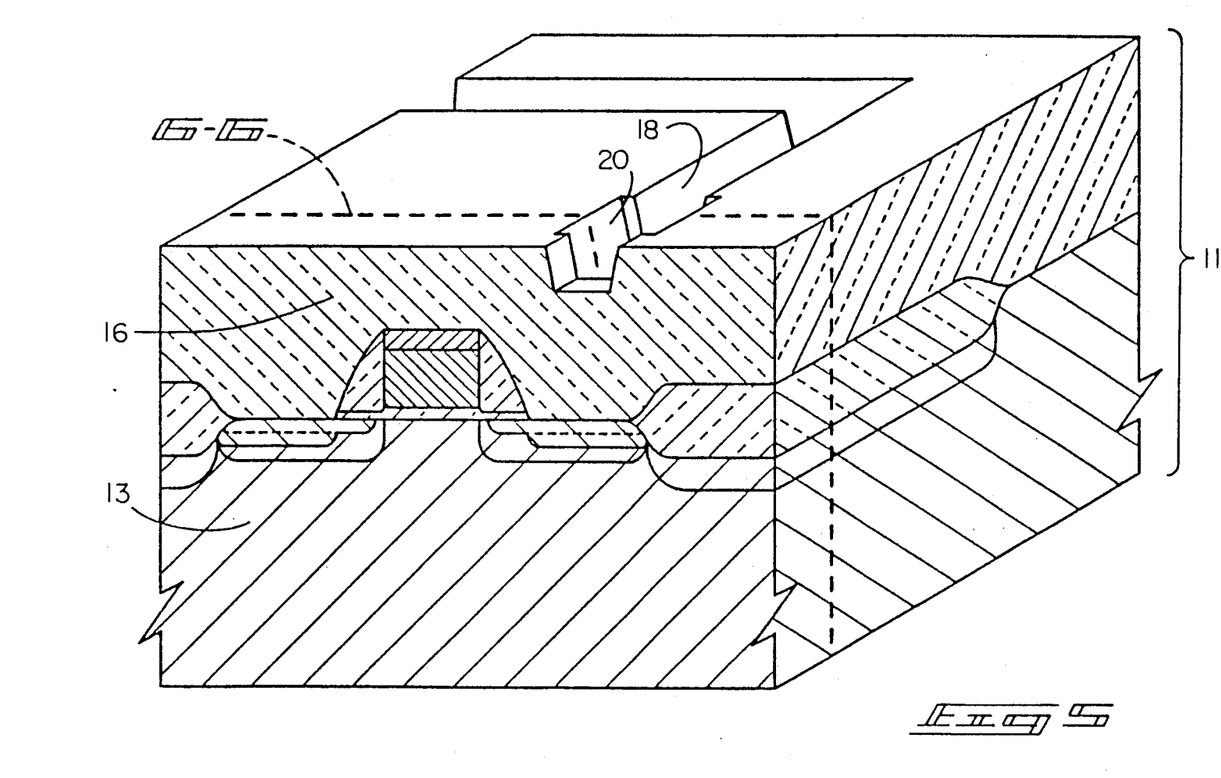
FIG. 5 is an isometric view of the wafer portion of FIG. 4, following removal of the second photo mask.

Referring now to FIG. 5, interconnect line channel 18 and via channel 20 are shown following the removal of second photo mask 19.

Figure 6:
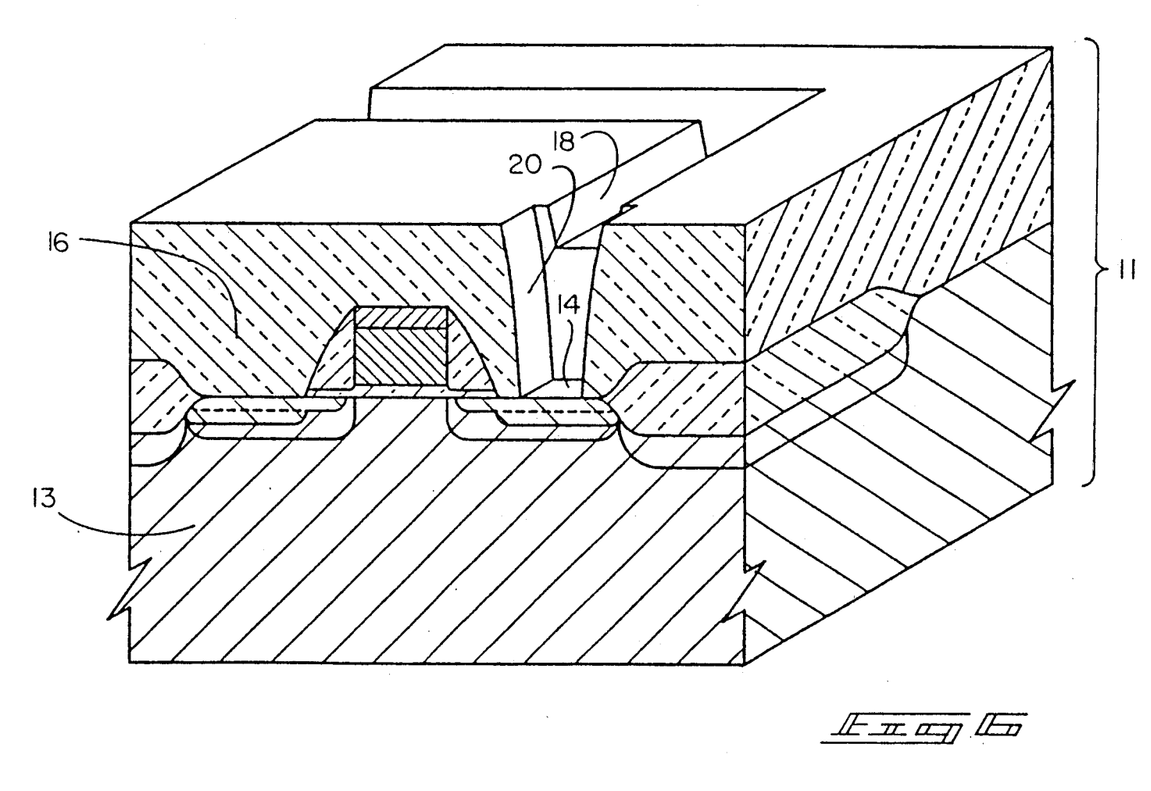
FIG. 6 is an isometric view of the wafer portion of FIG. 5, with the frontal portion up to the plane defined by broken line 6—6 in FIG. 5 removed to show a cross-section through the via.

Referring now to FIG. 6, which is a cross-sectional view through the plane defined by broken lines 6—6 of FIG. 5, the internal geometry of via channel 20 is more readily apparent. FET drain 14 is exposed by via 20.

Figure 7:
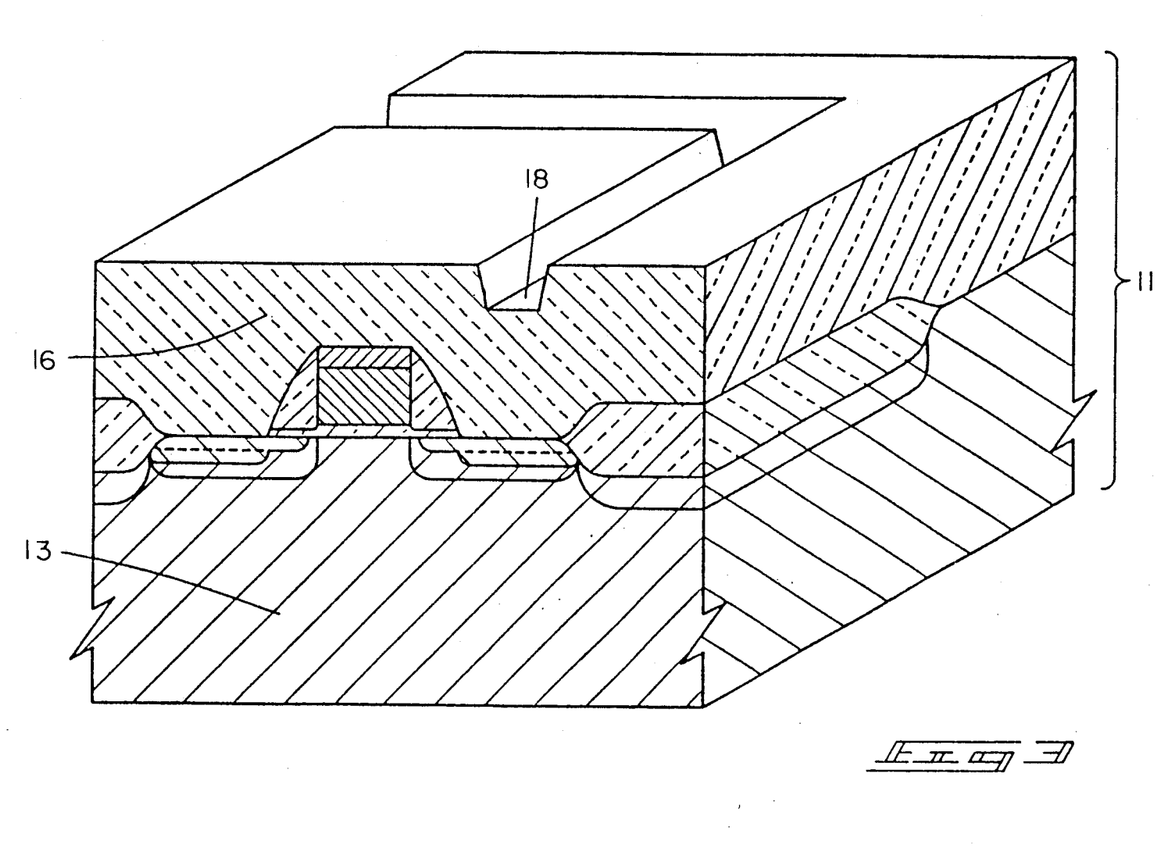
FIG. 7 is an isometric view of the wafer portion of FIG. 5, following the chemical vapor deposition of a ductile metal layer on top thereof.

Referring now to FIG. 7, a conformal solid metal layer 21 has been deposited on top of dielectric layer 16 such that metal layer 21 is provided as a ductile, solid, unitary integral mass metal layer on top of dielectric layer 16. Deposition may be done by any number of means such as chemical vapor deposition, sputter deposition or other techniques. The solid metal of solid metal layer 21 preferably has some degree of hardness which is significantly less than the hardness of dielectric layer 16, and is sufficiently soft to exhibit ductility. Ductility of the solid metal layer is the phenomenon which makes the remainder of the described plastic deforming process practical.

Figure 8:
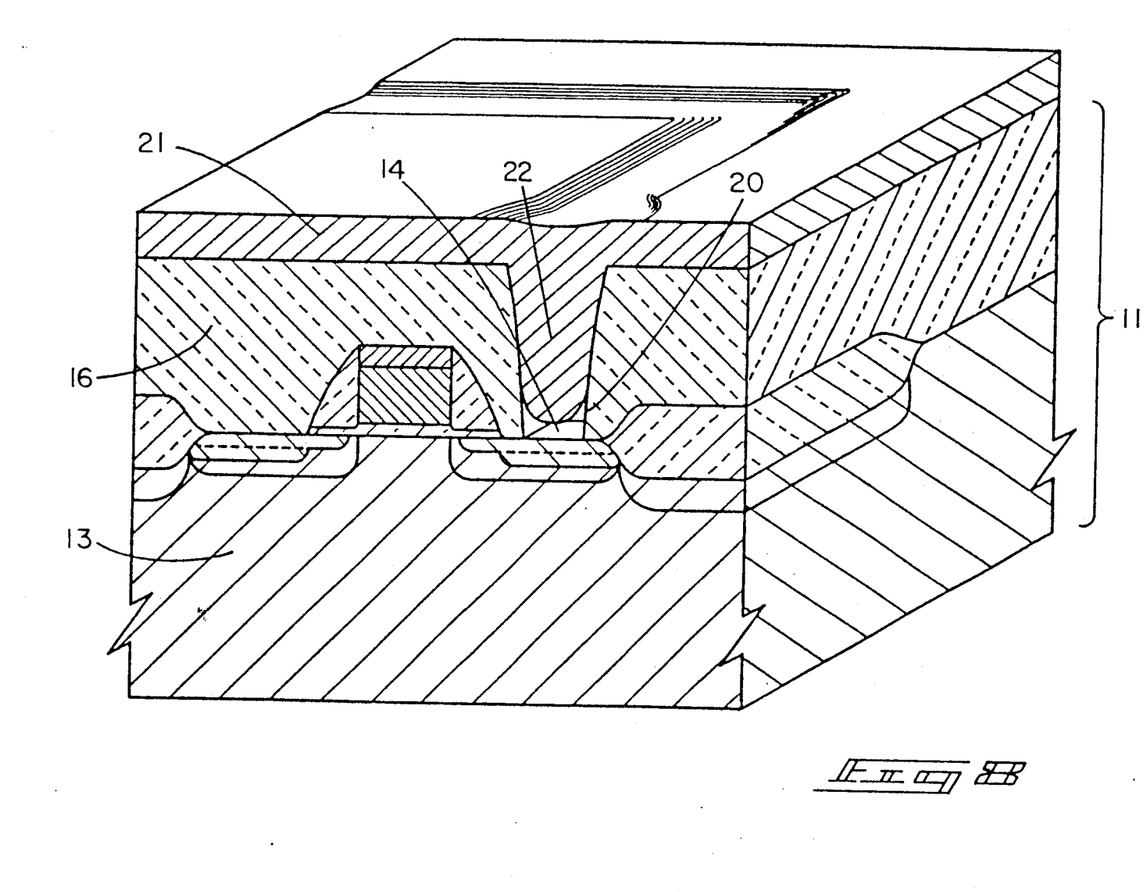
FIG. 8 is an isometric view of the wafer portion of FIG. 7, with the frontal portion up to the plane defined by broken line 8—8 in FIG. 7 removed to show a cross-section through the via.

Referring now to FIG. 8, which is a cross-sectional view through the plane defined by broken lines 8—8 of FIG. 7, a conductive via plug 22 has been formed within via channel 20. However, step coverage of the via plug 22 within the via channel 20 is illustrated as being incomplete and poor. In this case, via plug 22 does not adequately contact FET drain 14. Hence, the transistor would be inoperative if no further steps were taken to improve the quality of this connection.

Figure 9:
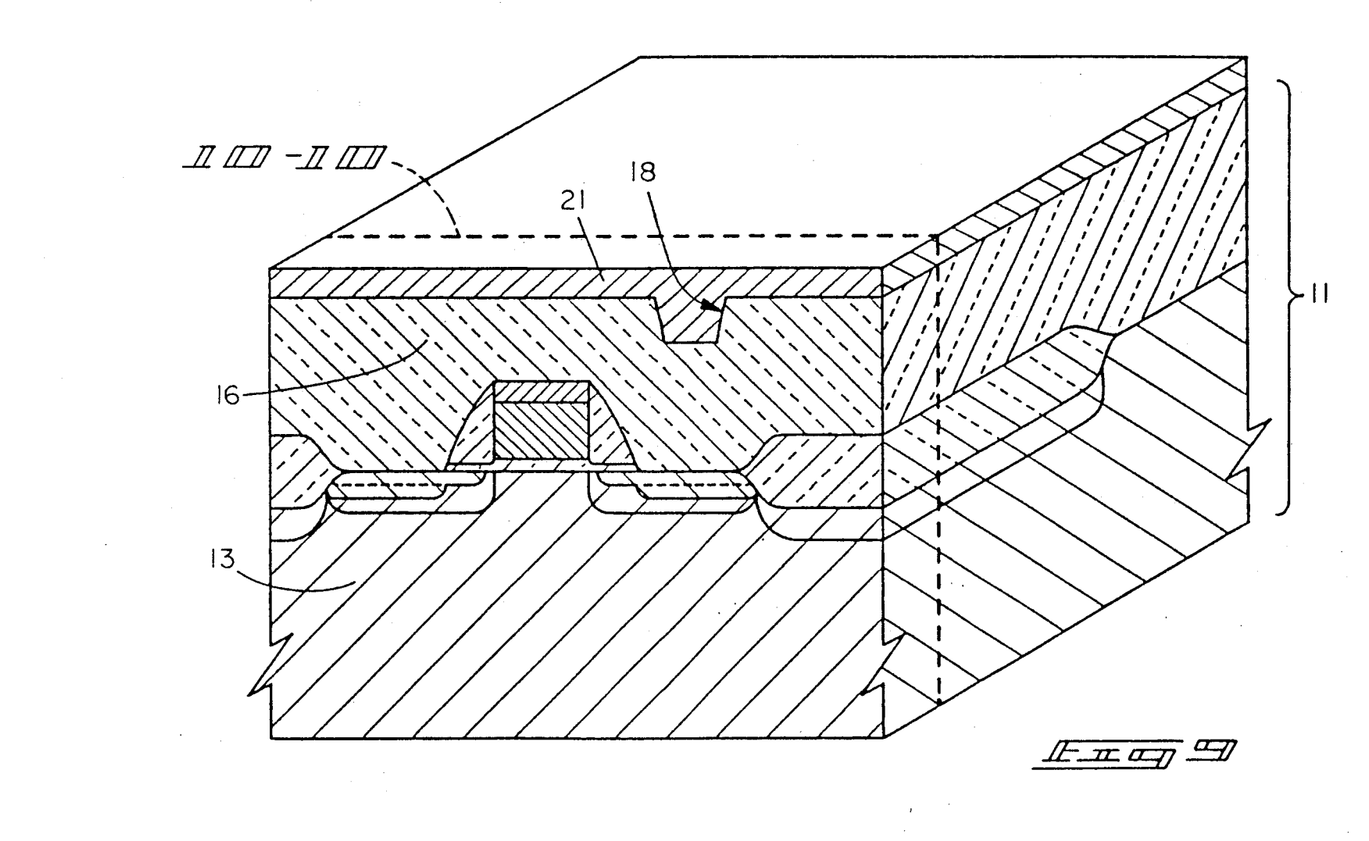
FIG. 9 is an isometric view of the wafer portion of FIG. 7, following plastic deformation of the solid metal layer with a smearing disk.

Referring now to FIG. 9, ductile metal layer 21 has been polished using a rotating disk or a vibrating pad held in contact therewith. The disk or pad may be made of any material having sufficient structural integrity to transfer mechanical energy to metal layer 21. The material could have a hardness which is either greater than the hardness of the ductile metal, or softer than the ductile metal. Metal layer 21 is plastically deformed, as indicated, by input of mechanical energy with the disk or pad to the solid ductile metal. This will cause the metal of layer 21 to be ductilely forced into interconnect channel 18 and via 20 (not shown in this Figure). During this plastic deformation step, the metal layer 21 is being both stretched and compressed by the disk or pad.

Disks or pads made of metal and durable polymer plastics such as tetrafluoroethylene have been successfully. Rotation of a disk may be unidirectional or reciprocatingly bidirectional (disk rotating and moved back and forth along a line while moved over the wafer), with bidirectional being the preferred method. Bidirectional mechanical action tends to plastically deform and force the metal within the via or channel more uniformly. If a vibrating pad is used for the plastic deforming operation, it may be vibrated in either an omni-directional (vibrating equally in all radial directions) or an orbital mode (vibrating with a circular motion).

Referring now to FIG. 10, which is a cross-sectional view through the plane defined by broken lines 10—10 of FIG. 9, step coverage of the via plug 22 within via channel 20 has been greatly improved, with sound plug-to-FET-drain contact having been obtained.

Figure 11:
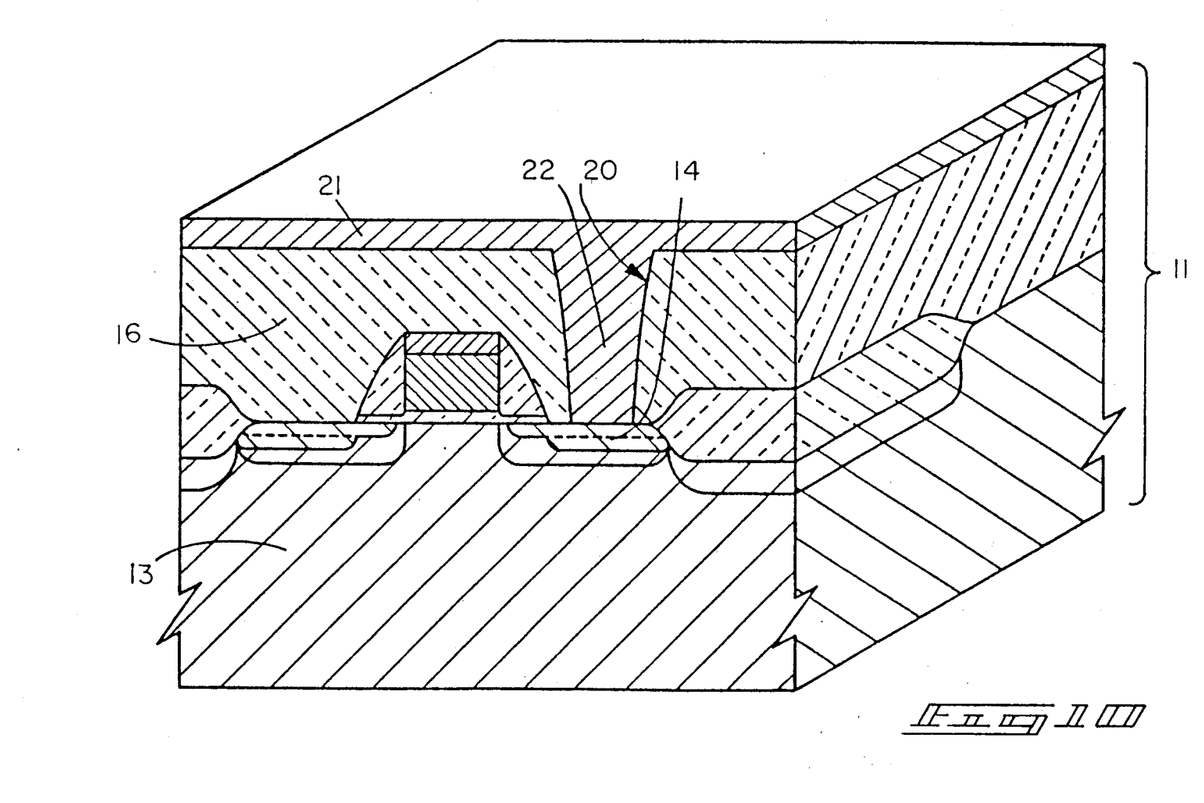
FIG. 11 is an isometric view of the wafer portion of FIG. 9, following a polish that removes all excess metal.

Referring now to FIG. 11, a dry polish without any slurry has been used to remove all excess metal of metal layer 21 from the planarized surface of dielectric layer 16, such that ductile metal remains only in channel 18 and via 20 (not shown in this Figure). The dry polish is conducted with a solid material having a hardness which is less than both the hardness of the metal and the hardness of the underlying dielectric layer 16, which would typically be silicon dioxide. Dry polishing can be conducted with either a rotating disk or a vibrating pad which is in contact with the metal layer 21. The disk can be operated in either a unidirectional or a reciprocatingly bidirectional manner, with unidirectional rotation being preferred. Vibration with a pad can be conducted either in an omni-directional or orbital mode.

Preferred materials for the dry polish disks or pads are polymer plastics, such as polyethylene and Teflon TM, and rubber. The dry polishing functions to remove ductile metal in a manner similar to how an eraser removes pencil marks from paper. The mechanical energy of friction enables the softer material disk to remove the harder ductile metal material.

This dry polishing method (without any slurry) in accordance with the invention costs less than a slurry polish removal and is easier to conduct. Slurry polishing must be carefully controlled to a defined end point to avoid stripping metal from within the channel and also to avoid removing material from the surrounding dielectric layer. Dry polishing with a material softer than the ductile metal (without any slurry) makes end point less critical as any damage to the underlying dielectric would be highly unlikely. The underlying dielectric is typically silicon dioxide which is much, much harder than the ductile metal. While the friction from dry polishing is sufficient to remove the ductile metal, it would not be sufficient to remove an appreciable amount of silicon dioxide dielectric were polishing continued after the excess metal was removed. As such, end point is less critical with dry polishing in accordance with the invention and damage to the dielectric layer less likely if polishing is not stopped at a precise end point.

Figure 12:
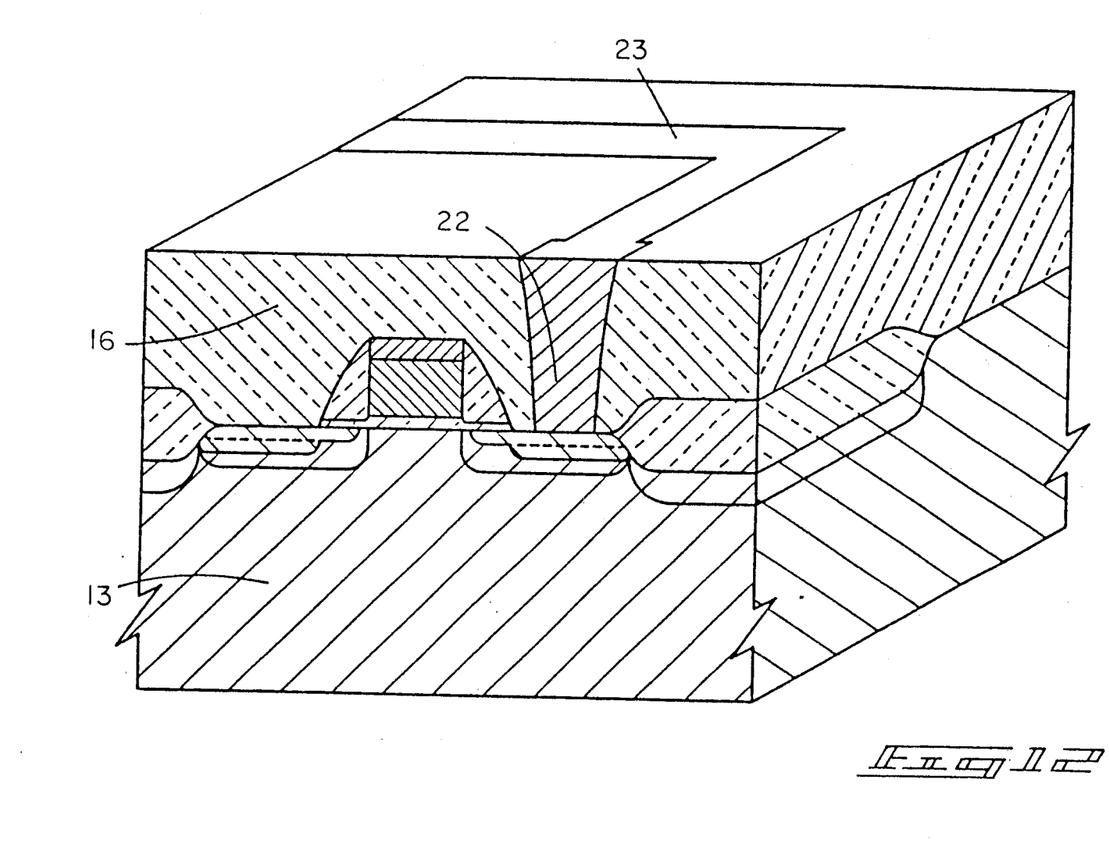
FIG. 12 is an isometric view of the wafer portion of FIG. 11, with the frontal portion up to the plane defined by broken line 12—12 in FIGS. 13-18 are cross-sectional views of a partially processed wafer after various processing steps according to the invention.

FIGS. 11 and 12 illustrate the via plug and interconnect line 23 being fully formed and forced completely therewithin.

During the step of plastically deforming the solid crystalline metal layer, the crystalline structure of the metal may become broken or otherwise damaged. An optional high-temperature step may be used to recrystallize the plastically deformed metal in such instance. For example, heating at 400° C. for 30 minutes would be sufficient to recrystallize a ductile metal alloy of aluminum, silicon, and copper (98.5% Al; 1% Si; 0.5% Cu). Alternately and more preferred, the wafer is subjected to a laser anneal which melts and recrystallizes the ductile metal. Preferably, such laser annealing is conducted in a raster pattern of 25 nanoseconds bursts for each 3 mm square exposure area.

Figure 13:
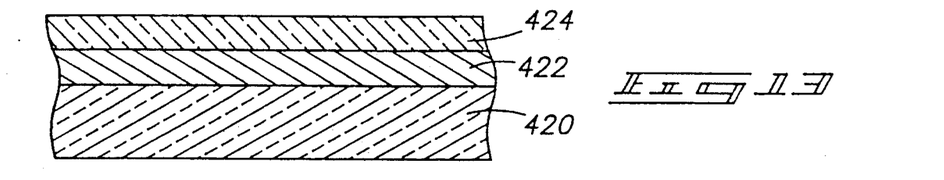

Reference is now made to FIGS. 13-18 which diagrammatically illustrate the crystallized nature of the ductile metal. FIG. 13 shows the cross-section of a portion of a partially processed semiconductor wafer 420. A conductive layer 422 is formed on top of semiconductor wafer 420. Conducting layer 422 can be doped silicon, polycrystalline silicon or metal. An insulating layer 424 (e.g., silicon dioxide or silicon nitride) is formed on top of the conductive layer 422.

Figure 14:
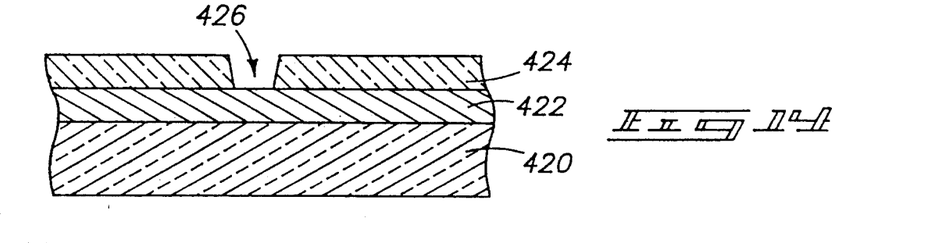
Figure 15:
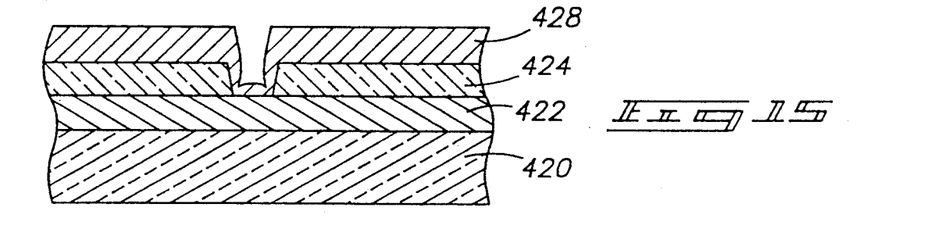

In FIG. 14, a via hole 426 has been formed through insulating layer 424 using conventional techniques. FIG. 15 shows that a metal layer 428 has been deposited by any one of a number of known deposition techniques. FIG. 15 shows that there is a void in metal layer 428 within the confines of via hole 426. Metal layer 28 is a solid integral mass formed of a ductal material such as aluminum, copper, gold, silver, tin or metals with similar ductility.

Figure 16:
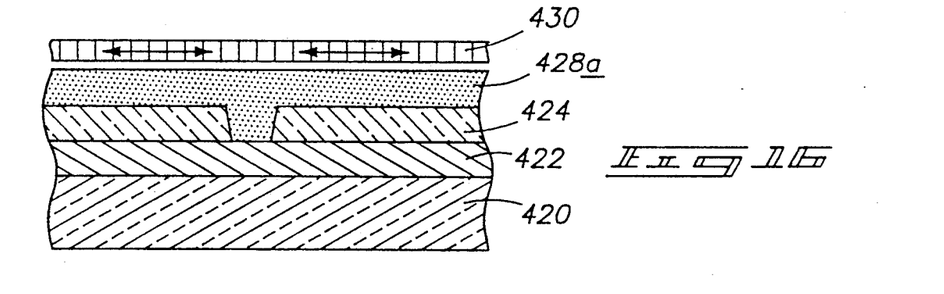
Figure 17:
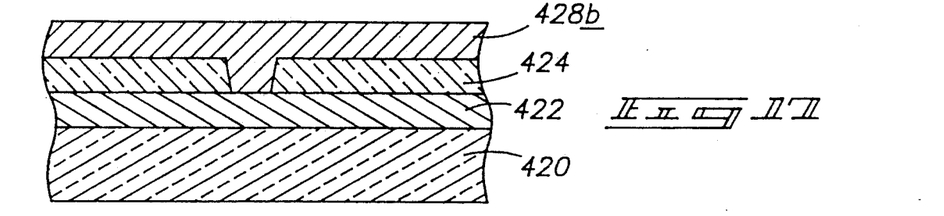
Figure 18:
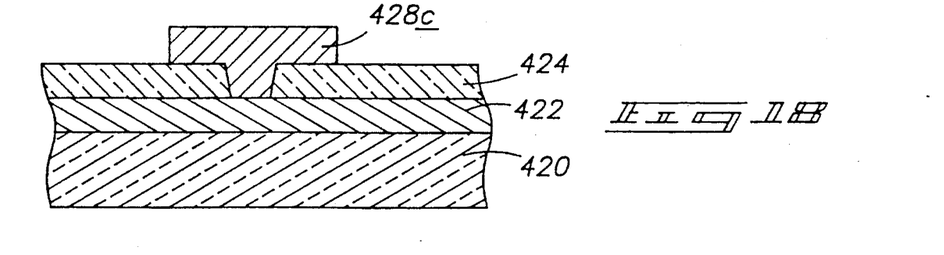

Referring to FIG. 16, a rotating disk 430 or vibrating pad is held in contact with metal layer 428 with sufficient pressure to plastically deform and mechanically force the ductile metal more completely into the void, but not damage the underlying structure. As metal layer 428 is deformed by this mechanical energy, crystalline boundaries can be broken, changing the nature of the layers such as illustrated in FIG. 16 as layer 428a. The wafer can be subjected to the above-described anneal to recrystallize the metal as indicated in FIG. 17. FIG. 18 shows that portions of metal layer 428b have been removed leaving a pattern of metal interconnect 428c on the surface of the wafer. Such would be conducted using known techniques.

Although methods have been disclosed for forming both conductive via plugs and interconnect lines, the techniques for creating both are essentially the same. Both via plugs and interconnect lines are conductive paths, the difference being that via plugs provide vertical conductive paths, while interconnect lines provide horizontal conductive paths. In order to create either a via or an interconnect line utilizing the present invention, a depression (whether via or channel) is etched into a dielectric layer, solid ductile metal is deposited on top of the dielectric layer, the solid ductile metal is then ductilely forced into the depression using mechanical action. A dry polishing operation (no slurry) removes the excess metal, leaving metal only in the depression.

In compliance with the statute, the invention has been described in language more or less specific as to structural and methodical features. It is to be understood, however, that the invention is not limited to the specific features shown and described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A method of forming a conductive path of ductile metal within an exposed, planarized dielectric layer of an integrated circuit comprising the following sequential steps:

masking the dielectric layer with a photoresist mask in order to define a geometry of a conductive path;

etching the dielectric layer in order to create a depression within the dielectric layer;

removing the photoresist mask;

depositing a ductile metal to provide a ductile, solid, unitary integral mass metal layer on top of the dielectric layer, the solid metal layer incompletely filling the depression; and plastically deforming the solid metal layer through an input of mechanical energy in order to ductilely force the ductile metal from the ductile metal layer more completely into the depression.

2. The method of forming a conductive path of ductile metal of claim 1 wherein the step of plastically deforming is accomplished with a rotating disk maintained in contact with the metal layer.

3. The method of forming a conductive path of ductile metal of claim 2 comprising rotating the disk in a reciprocatingly bidirectional manner.

4. The method of forming a conductive path of ductile metal of claim 2 wherein the disk is made of metal.

5. The method of forming a conductive path of ductile metal of claim 2 wherein the disk is made of a polymer plastic material.

6. The method of forming a conductive path of ductile metal of claim 1 wherein the step of plastically deforming is accomplished with a non-rotating vibrating pad maintained in contact with said metal layer.

7. The method of forming a conductive path of ductile metal of claim 1 further comprising annealing the plastically deformed metal within the depression to cause recrystallization thereof.

8. The method of forming a conductive path of ductile metal of claim 7 wherein the annealing includes impinging laser energy onto the metal within the depression for sufficient duration to melt the metal.

9. The method of forming a conductive path of ductile metal of claim 8 the laser energy is impinged onto the metal in a raster array for about 25 nanoseconds per 3 square millimeter areas.

10. The method of forming a conductive path of ductile metal of claim 1 wherein the step of plastically deforming is accomplished with a rotating disk maintained in contact with the metal layer, and further comprising annealing the plastically deformed metal within the depression to cause recrystallization thereof.

11. The method of forming a conductive path of ductile metal of claim 1 wherein the step of plastically deforming is accomplished with a rotating disk maintained in contact with the metal layer, and further comprising annealing the plastically deformed metal within the depression to cause recrystallization thereof, the annealing including impinging laser energy onto the metal within the depression for sufficient duration to melt the metal.

12. A method of forming an interconnect line within an exposed planarized dielectric layer of an integrated circuit, the interconnect lie communicating with a conductive plug within a via that contacts a conductive layer below said dielectric layer, the method comprising the following sequential steps;

masking the dielectric layer with a first photoresist mask in order to define a geometry of an interconnect line;

subjecting the dielectric layer to a first etch in order to create an interconnect line channel in the dielectric layer;

removing the first photoresist mask;

masking the dielectric layer with a second photoresist mask in order to define a geometry of a via, the via being at least partially coincident with the interconnect line channel;

subjecting the dielectric layer to a second etch in order to create a via channel which extends through the dielectric layer to a conductive layer;

depositing a ductile metal to provide a ductile, solid, unitary integral mass metal layer on top of the dielectric layer, the solid metal layer incompletely filling the depression;

plastically deforming the solid metal layer through an input of mechanical energy in order to ductilely force the ductile metal from the ductile metal layer more completely into the depression.

13. The method of forming a conductive path of ductile metal of claim 12 wherein the step of plastically deforming is accomplished with a rotating disk maintained in contact with the metal layer.

14. The method of forming a conductive path of ductile metal of claim 12 wherein the step of plastically deforming is accomplished with a non-rotating vibrating pad maintained in contact with said metal layer.

15. The method of forming a conductive path of ductile metal of claim 12 further comprising annealing the plastically deformed metal within the depression to cause recrystallization thereof.

16. A method of forming a conductive path of ductile metal within an exposed, planarized dielectric layer of an integrated circuit comprising the following sequential steps:

masking the dielectric layer with a photoresist mask in order to define a geometry of a conductive path;

etching the dielectric layer in order to create a depression within the dielectric layer;

removing the photoresist mask;

sputter depositing a ductile metal to provide a solid ductile metal layer on top of the dielectric layer; and plastically deforming the solid metal layer through an input of mechanical energy in order to ductilely force the ductile metal from the ductile metal layer more completely into the depression.

17. The method of forming a conductive path of ductile metal of claim 16 wherein the step of plastically deforming is accomplished with a rotating disk maintained in contact with the metal layer.

18. The method of forming a conductive path of ductile metal of claim 16 wherein the step of plastically deforming is accomplished with a non-rotating vibrating pad maintained in contact with said metal layer.

19. The method of forming a conductive path of ductile metal of claim 16 further comprising annealing the plastically deformed metal within the depression to cause recrystallization thereof.

20. The method of forming a conductive path of ductile metal of claim 19 wherein the annealing includes impinging laser energy onto the metal within the depression for sufficient duration to melt the metal.

21. A method of forming a conductive path of ductile metal within an exposed, planarized dielectric layer of an integrated circuit comprising the following sequential steps:

masking the dielectric layer with a photoresist mask in order to define a geometry of a conductive path;

etching the dielectric layer in order to create a depression within the dielectric layer;

removing the photoresist mask;

chemical vapor depositing a ductile metal to provide a solid ductile metal layer on top of the dielectric layer; and plastically deforming the solid metal layer through an input of mechanical energy in order to ductilely force the ductile metal from the ductile metal layer more completely into the depression.

22. The method of forming a conductive path of ductile metal of claim 21 wherein the step of plastically deforming is accomplished with a rotating disk maintained in contact with the metal layer.

23. The method of forming a conductive path of ductile metal of claim 21 wherein the step of plastically deforming is accomplished with a non-rotating vibrating pad maintained in contact with said metal layer.

24. The method of forming a conductive path of ductile metal of claim 21 further comprising annealing the plastically deformed metal within the depression to cause recrystallization thereof.

25. The method of forming a conductive path of ductile metal of claim 24 wherein the annealing includes impinging laser energy onto the metal within the depression for sufficient duration to melt the metal.

26. A method of forming a conductive path of ductile metal within an exposed, planarized dielectric layer on a semiconductor wafer containing an integrated circuit, the dielectric layer having a defined hardness, the method comprising the following sequential steps:

masking the dielectric layer with a photoresist mask in order to define a geometry of a conductive path;

etching the dielectric layer in order to create a depression within the dielectric layer;

removing the photoresist mask;

depositing a solid ductile metal layer on top of the dielectric layer and within the depression, the solid metal of the solid metal layer having a defined hardness, the solid metal layer incompletely filling the depression;

plastically deforming the solid the metal layer through the input of mechanical energy in order to ductilely force solid metal from the solid ductile metal layer more completely into the depression; and dry polishing without any slurry the solid metal layer with a solid material having a hardness which is less than both the hardness of the metal and the hardness of the dielectric layer to provide remaining metal from the metal layer which is only within the depression.

27. The method of forming a conductive path of ductile metal of claim 26 wherein the dry polishing is accomplished by rotating a disk which is contacted with the metal layer.

28. The method of forming a conductive path of ductile metal of claim 26 wherein the dry polishing is accomplished by vibrating a pad which is contacted with the metal layer.

29. The method of forming a conductive path of ductile metal of claim 26 wherein the step of plastically deforming is accomplished with a rotating disk maintained in contact with the metal layer.

30. The method of forming a conductive path of ductile metal of claim 26 wherein the step of plastically deforming is accomplished with a non-rotating vibrating pad maintained in contact with said metal layer.

31. The method of forming a conductive path of ductile metal of claim 26 further comprising annealing the plastically deformed remaining metal within the depression to cause recrystallization thereof.

32. The method of forming a conductive path of ductile metal of claim 31 wherein the annealing includes impinging laser energy onto the metal within the depression for sufficient duration to melt the metal.

33. A method of forming an interconnect line within an exposed planarized dielectric layer on a semiconductor wafer containing an integrated circuit, the dielectric layer having a defined hardness, the interconnect line communicating with a conductive plug within a via that contacts a conductive layer below the dielectric layer, the method comprising the following sequential steps:

masking the dielectric layer with a first photoresist mask in order to define a geometry of an interconnect line;

subjecting the dielectric layer to a first etch in order to create an interconnect line channel in the dielectric layer;

removing the first photoresist mask;

masking the dielectric layer with a second photoresist mask in order to define a geometry of a via, the via being at least partially coincident with the interconnect line channel;

subjecting the dielectric layer to a second etch in order to create a via channel which extends through the dielectric layer to a conductive layer on the wafer;

depositing a solid ductile metal layer on top of the dielectric layer, the solid metal of the solid metal layer having a defined hardness, the solid metal layer incompletely filling the via channel;

plastically deforming the solid metal layer through the input of mechanical energy in order to ductilely force solid metal from the solid ductile metal layer more completely into the via channel and into the interconnect line channel; and dry polishing without any slurry the solid metal layer with a solid material having a hardness which is less than both the hardness of the metal and the hardness of the dielectric layer to provide remaining metal from the metal layer which is only within the via and the interconnect line channel.

34. The method of forming a conductive path of ductile metal of claim 33 wherein the dry polishing is accomplished by rotating a disk which is contacted with the metal layer.

35. The method of forming a conductive path of ductile metal of claim 33 wherein the dry polishing is accomplished by vibrating a pad which is contacted with the metal layer.

36. The method of forming a conductive path of ductile metal of claim 33 wherein the step of plastically deforming is accomplished with a rotating disk maintained in contact with the metal layer.

37. The method of forming a conductive path of ductile metal of claim 33 wherein the step of plastically deforming is accomplished with a non-rotating vibrating pad maintained in contact with said metal layer.

38. The method of forming a conductive path of ductile metal of claim 33 further comprising annealing the plastically deformed remaining metal within the depression to cause recrystallization thereof.

39. The method of forming a conductive path of ductile metal of claim 38 wherein the annealing includes impinging laser energy onto the metal within the depression for sufficient duration to melt the metal.

40. A method of removing excess metal from a metal layer atop an underlying layer on a semiconductor substrate wafer, the metal layer having been applied to fill conductive interconnect lines or vias formed within the underlying layer, the metal and underlying layer having defined hardnesses, the method comprising:

dry polishing the metal layer without any slurry, the dry polishing being conducted only with a solid material having a hardness which is less than both the hardness of the metal and the hardness of the underlying layer to provide remaining metal from the metal layer which is only in conductive interconnect lines or vias.

41. The method of removing excess metal from a metal layer atop an underlying layer on a semiconductor substrate wafer of claim 40 wherein the dry polishing is accomplished by rotating a disk which is contacted with the metal layer.

42. The method of removing excess metal from a metal layer atop an underlying layer on a semiconductor substrate wafer of claim 41 wherein the disk is made of a polymer plastic material.

43. The method of removing excess metal from a metal layer atop an underlying layer on a semiconductor substrate wafer of claim 41 wherein the disk is made of rubber.

44. The method of removing excess metal from a metal layer atop an underlying layer on a semiconductor substrate wafer of claim 41 wherein the disk is made of a material selected from the group consisting of polyethylene and Teflon TM.

45. The method of removing excess metal from a metal layer atop an underlying layer on a semiconductor substrate wafer of claim 41 further comprising rotating the disk in a reciprocatingly bidirectional manner.

46. The method of removing excess metal from a metal layer atop an underlying layer on a semiconductor substrate wafer of claim 40 wherein the dry polishing is accomplished by vibrating a pad which is contacted with the metal layer.

47. The method of removing excess metal from a metal layer atop an underlying layer on a semiconductor substrate wafer of claim 46 wherein the pad is made of a polymer plastic material.

48. The method of removing excess metal from a metal layer atop an underlying layer on a semiconductor substrate wafer of claim 46 wherein the pad is made of rubber.

49. The method of removing excess metal from a metal layer atop an underlying layer on a semiconductor substrate wafer of claim 46 wherein the pad is made of a material selected from the group consisting of polyethylene and Teflon TM.

* * * * *